(12) United States Patent
Zhang

(10) Patent No.: US 11,456,429 B2
(45) Date of Patent: Sep. 27, 2022

(54) ARRAY SUBSTRATE AND DISPLAY DEVICE HAVING THE SAME

(71) Applicant: WUHAN CHINA STAR OPTOELECTRONICS SEMICONDUCTOR DISPLAY TECHNOLOGY CO., LTD., Hubei (CN)

(72) Inventor: Fuyang Zhang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 505 days.

(21) Appl. No.: 16/476,947

(22) PCT Filed: Apr. 17, 2019

(86) PCT No.: PCT/CN2019/083071
§ 371 (c)(1),
(2) Date: Jul. 10, 2019

(87) PCT Pub. No.: WO2020/172968
PCT Pub. Date: Sep. 3, 2020

(65) Prior Publication Data
US 2021/0408401 A1    Dec. 30, 2021

(30) Foreign Application Priority Data

Feb. 27, 2019   (CN) .......................... 201910147672.8

(51) Int. Cl.
*B32B 3/02*     (2006.01)
*H01L 51/00*    (2006.01)
(Continued)

(52) U.S. Cl.
CPC .......... *H01L 51/0097* (2013.01); *B32B 27/08* (2013.01); *B32B 27/281* (2013.01);
(Continued)

(58) Field of Classification Search
CPC ......... H01L 51/0097; H01L 2251/5338; B32B 3/02; B32B 2307/7244; B32B 2307/7246;
(Continued)

(56) References Cited

FOREIGN PATENT DOCUMENTS

CN           107845643         *  3/2018

* cited by examiner

*Primary Examiner* — Elizabeth E Mulvaney

(57) ABSTRACT

The present invention discloses an array substrate and a display device including the same, the array substrate including a display area and a non-display area, wherein the non-display area has a bending region connected to the display area; a first base layer extends from the display area to the bending region; a water-oxygen barrier layer is disposed on the first base layer of the display area; a second base layer is disposed on the water-oxygen barrier layer of the display area and the first base layer of the bending region; a metal trace disposed over the second base layer and extending from the display area to the bending region. In the present invention, a water-oxygen barrier layer only in the display region is provided, and a more reasonable functional layer is designed, which effectively improve stress distribution in the bending region during bending to prevent the metal trace from breakage.

10 Claims, 2 Drawing Sheets

(51) Int. Cl.
*B32B 27/08* (2006.01)
*B32B 27/28* (2006.01)
*H01L 27/32* (2006.01)

(52) U.S. Cl.
CPC ...... *H01L 27/3244* (2013.01); *B32B 2255/10* (2013.01); *B32B 2255/20* (2013.01); *B32B 2255/205* (2013.01); *B32B 2307/204* (2013.01); *B32B 2307/206* (2013.01); *B32B 2307/7244* (2013.01); *B32B 2307/7246* (2013.01); *B32B 2457/20* (2013.01); *H01L 2251/5338* (2013.01)

(58) Field of Classification Search
CPC .......... B32B 2457/20; B32B 2457/206; B32B 2457/208
See application file for complete search history.

ARRAY SUBSTRATE AND DISPLAY DEVICE HAVING THE SAME

BACKGROUND OF INVENTION

Field of Invention

The present invention relates to a field of displays and the like, and particularly to an array substrate and a display device including the array substrate.

Description of Prior Art

With the development of active matrix organic light emitting diode (AMOLED) display technology, people's demands on display panels are increasing, especially on designs of display panel bezels, such as designs of narrow bezels, especially designs of ultra-narrow lower bezels.

In theory, the AMOLED adopts a flexible substrate to realize a structure design of the ultra-narrow lower bezel, but the lower bezel of the display panel needs to be bent so that the display area of the display panel is unchanged, while the non-display area is folded to a back side of the display panel. In the actual manufacture process, there are many difficulties, especially in a bending process, a metal trace in the bending region is stressed and deformed due to bending, which easily leads to metal trace breakage. Therefore, how to ensure the reliability of the metal trace in the bending region, that is, the metal trace is not damaged due to the bending, is an urgent problem to be solved.

SUMMARY OF INVENTION

In order to solve the above technical problem, the present invention provides an array substrate and a display device including the array substrate. By providing a water-oxygen barrier layer only in the display region, stress distribution in the bending region during bending can be improved to prevent the metal trace from breakage when it is bent.

A technical solution to solve the above problem is: the present invention provides a display area and a non-display area, the non-display area having a bending region connected to the display area; a first base layer extending from the display area to the bending region; a water-oxygen barrier layer disposed on the first base layer of the display area; a second base layer disposed on the water-oxygen barrier layer of the display area and on the first base layer of the bending region; and a metal trace disposed over the second base layer and extending from the display area to the bending region.

In an embodiment of the present invention, in the display area and the bending region, the array substrate further includes: a buffer structure layer disposed on the second base layer; a first gate insulating layer disposed on the buffer structure layer; a second gate insulating layer disposed on the first gate insulating layer; a dielectric layer disposed on the second gate insulating layer, wherein the metal trace is disposed on the dielectric layer; and a planarization structure layer disposed on the dielectric layer and the metal trace.

In an embodiment of the present invention, the buffer structure layer includes a first buffer layer disposed on the second base layer; a second buffer layer disposed on the first buffer layer; and a third buffer layer disposed on the second buffer layer; wherein the first buffer layer is made of silicon dioxide, the second buffer layer is made of silicon oxynitride, and the third buffer layer is made of silicon dioxide.

In an embodiment of the present invention, the first buffer layer has a thickness of 450 nm to 550 nm; the second buffer layer has a thickness of 35 nm to 45 nm; and the third buffer layer has a thickness of 180 nm to 220 nm.

In an embodiment of the present invention, the planarization structure layer includes a first planarization layer disposed on the dielectric layer and the metal trace; and a second planarization layer disposed on the first planarization layer; wherein the first planarization layer and the second planarization layer are both made of polyimide, and wherein the first planarization layer has a thickness of 1 μm to 2 μm, and the second planarization layer has a thickness of 2 μm to 4 μm.

In an embodiment of the present invention, in the display area, the array substrate further includes: an active layer disposed on the buffer structure layer, the active layer having a source region and a drain region; a first gate layer disposed on the first gate insulating layer; a second gate layer disposed on the second gate layer; a source and a drain, the source extending from the metal trace to the source region of the active layer, the drain extending from the metal trace to the drain region of the active layer; and an anode trace disposed on the planarization structure layer and connected to the drain.

In an embodiment of the present invention, the anode trace includes a first protective layer; a first metal layer disposed on the first protective layer; and a second protective layer disposed on the first metal layer; wherein the first protective layer has a thickness of 10 nm to 20 nm, and the first metal layer has a thickness of 90 nm to 110 nm; and wherein the second protective layer has a thickness of 10 nm to 20 nm.

In an embodiment of the present invention, the first base layer and the second base layer are both made of polyimide, and the first base layer has a thickness of 5-15 um, and the second base layer has a thickness of 5-15 um.

In an embodiment of the present invention, the metal trace includes a second metal layer; a third metal layer disposed on the second metal layer; and a fourth metal layer disposed on the third metal layer; wherein the second metal layer has a thickness of 70 nm to 90 nm, the third metal layer has a thickness of 550 nm to 650 nm, and the fourth metal layer has a thickness of 70 nm to 90 nm.

In an embodiment of the present invention, the water-oxygen barrier layer is made of a material including at least one of silicon oxide, silicon nitride, and amorphous silicon.

The present invention also provides a display device including the array substrate.

An advantage of the present invention is that in the array substrate and the display device including the array substrate of the invention, stress distribution in the bending region during bending can be improved to prevent the metal trace from breakage when it is bent, which is achieved by providing a water-oxygen barrier layer only in the display region and designing a more reasonable functional layer. In addition, the metal trace adopts a multilayered structure of titanium-aluminum-titanium, which can further enhance the strength of the metal trace to mitigate the deformation of the metal trace when it is bent.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the pres

Figure 1:
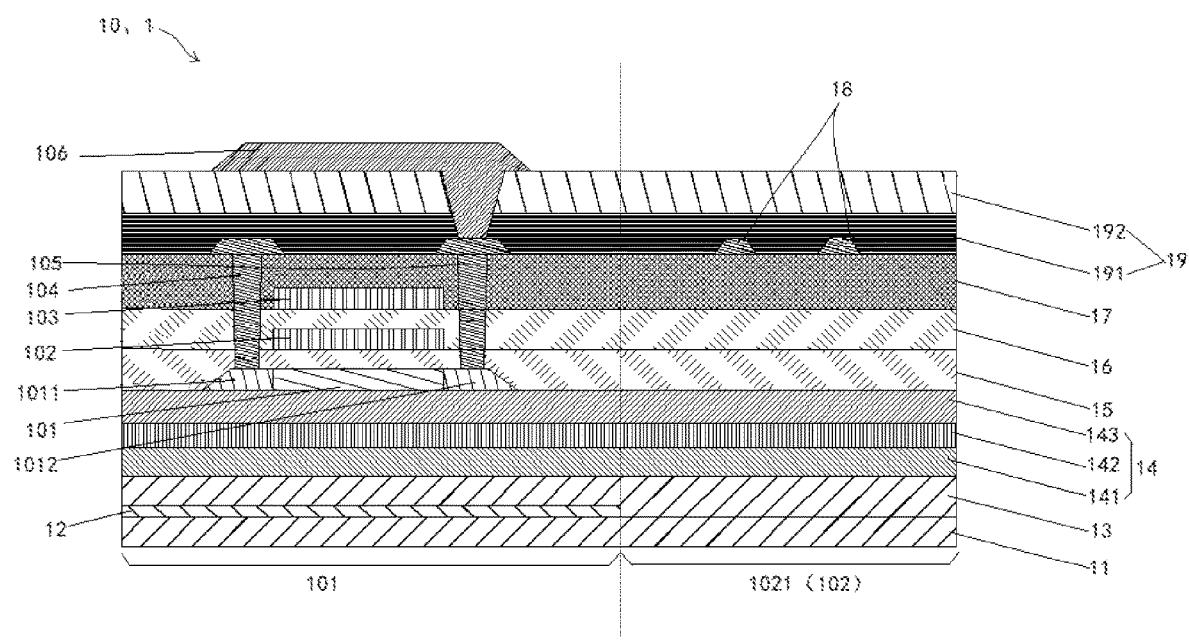
- FIG. 1 is a schematic structural view of an array substrate according to an embodiment of the present invention.

Elements in the drawings are designated by reference numerals listed below.

1 display device; 10 array substrate; 101 display area; 102 non-display area; 1021 bending region; 11 first base layer; 12 water-oxygen barrier layer; 13 second base layer; 14 buffer structure layer; 15 first gate insulating layer; 16 second gate insulating layer; 17 dielectric layer; 18 metal trace; 19 planarization structure layer; 101 active layer; 102 first gate layer; 103 second gate layer; 104 source; 105 drain; 106 anode trace; 141 first buffer layer; 142 second buffer layer; 143 third buffer layer; 181 second metal layer; 182 third metal layer; 183 fourth metal layer; 191 first planarization layer; 192 second planarization layer; 1061 first protective layer; 1062 first metal layer; 1063 second protective layer; 1011 source region; 1012 drain region.

DETAILED DESCRIPTION OF PREFERRED EMBODIMENTS

With reference to the appended drawings, exemplary embodiments of the present invention will be described in detail below. To aid in understanding the present invention, like numbers refer to like elements throughout the description of the figures, and the description of the same elements will be not reiterated. For illustration clarity, many details of practice are explained in the following descriptions. However, it should be understood that these details of practice do not intend to limit the present disclosure.

The following description of the various embodiments is provided to illustrate the specific embodiments of the invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the figures which are merely references. The spatially relative terms are intended to encompass different orientations in addition to the orientation as depicted in the figures.

As shown in FIG. 1, in an embodiment, the array substrate 10 of the present invention includes a display area 101 and a non-display area 102, and the non-display area 102 has a bending region 1021 connected to the display area 101.

A structure of the array substrate 10 includes a first base layer 11, a water-oxygen barrier layer 12, a second base layer 13, and metal trace 18. The first base layer 11 extends from the display area 101 to the bending region 1021; the water-oxygen barrier layer 12 is disposed on the first base layer 11 of the display area 101, but does not extend to and on the first base layer 11 of the bending region 1021; the second base layer 13 is disposed on the water-oxygen barrier layer 12 of the display area 101 and extends to and on the first base layer 11 of the bending region 1021. The metal trace 18 is disposed above the second base layer 13 and extends from the display area 101 to the bending region 1021.

In the specific manufacture, polyimide is employed to form the first base layer 11 having a thickness of 5-15 um, preferably 10 um. Then, at least one of silicon oxide, silicon nitride, and amorphous silicon is deposited on the first base layer 11 of the display region 101 to form the water-oxygen barrier layer 12 having a thickness of 500 nm. Thereafter, the second base layer 13 is formed on the water-oxygen barrier layer 12 of the display area 101 and the first base layer 11 of the bending region 1021. The second base layer 13 and the first base layer 11 are made of the same material, which is also polyimide. The second base layer 13 has a thickness of 5-15 um. In the display area 101, the thickness of the second base layer 13 is preferably 10 um. In this embodiment, at least one of silicon oxide, silicon nitride, and amorphous silicon is deposited only on the first base layer 11 of the display region 101. Therefore, in the bending region 1021, there is no water-oxygen barrier layer 12 corresponding to the metal trace 18, so that when the bending region 1021 is bent, a neutral surface can be as close as possible to the metal trace 18, or the neutral surface falls within a level where the metal trace 18 is located, to improve the stress generated when the metal trace 18 is bent, preventing the metal trace 18 from breakage.

In the display area 101 and the bending region 1021, the structure of the array substrate 10 further includes a buffer structure layer 14, a first gate insulating layer 15, a second gate insulating layer 16, a dielectric layer 17, and a planarization structure layer 19. In the display region 101, the structure of the array substrate 10 further includes an active layer 101, a first gate layer 102, a second gate layer 103, a source 104 and a drain 105, and an anode trace 106.

The structure of the array substrate 10 will be described in detail below with reference to FIG. 1.

A buffer structure layer 14 is disposed on the second base layer 13. The buffer structure layer 14 is provided with a first buffer layer 141, a second buffer layer 142, and a third buffer layer 143. In a specific manufacture, a material of silicon oxide is deposited on the second base layer 13 to form the first buffer layer 141 having a thickness of 450 nm to 550 nm, preferably 500 nm. Thereafter, a material of silicon nitride is deposited on the first buffer layer 141 to form a second buffer layer 142 having a thickness of 35 nm to 45 nm, preferably 40 nm. Thereafter, a material of silicon oxide is deposited on the second buffer layer 142 to form a third buffer layer 143 having a thickness of 180 nm to 220 nm, preferably 200 nm.

An active layer 101 is disposed on the buffer structure layer 14 of the display region 101. The active layer 101 is doped with P+ ions, and the active layer 101 has a source region 1011 and a drain region 1012 and has a thickness ranging from 45 nm to 55 nm, preferably 50 nm.

A first gate insulating layer 15 is formed on the active layer 101 and the third buffer layer 143. In a specific manufacture, a material of silicon oxide is deposited on the active layer 101 and the third buffer layer 143 to form the first gate insulating layer 15 having a thickness ranging from 135 nm to 145 nm, preferably 140 nm.

The first gate layer 102 is disposed on the first gate insulating layer 15 of the display region 101. In a specific in, molybdenum is deposited to form the first gate layer 102 on the first gate insulating layer 15. The first gate layer 102 has a thickness ranging from 240 nm to 260 nm, preferably 250 nm.

The second gate insulating layer 16 is disposed on the first gate insulating layer 15 and covers the first gate layer 102 of the display region 101. In a specific manufacture, a material of silicon nitride is deposited on the first gate layer 102 and the first gate insulating layer 15 to form the second gate insulating layer 16 having a thickness ranging from 135 nm to 145 nm, preferably 140 nm.

The second gate layer 103 is disposed on the second gate insulating layer 16 of the display region 101. In a specific manufacture, molybdenum is deposited on the second gate insulating layer 16 to form the second gate layer 103 having a thickness of 240 nm to 260 nm, preferably 250 nm.

A dielectric layer 17 is disposed on the second gate insulating layer 16 and covers the second gate layer 103 of the display region 101. In a specific manufacture, a material of silicon oxide is deposited on the second gate insulating layer 16 and the second gate layer 103 to form the dielectric layer 17 having a thickness of 450 nm to 550 nm, preferably 500 nm. Then, via holes are formed in the display region 101, and the via holes penetrate the dielectric layer 17 to the active layer 101, wherein one of the via holes corresponds to the source region 1011, and another one of the via holes corresponds to the drain region 1012.

Figure 2:
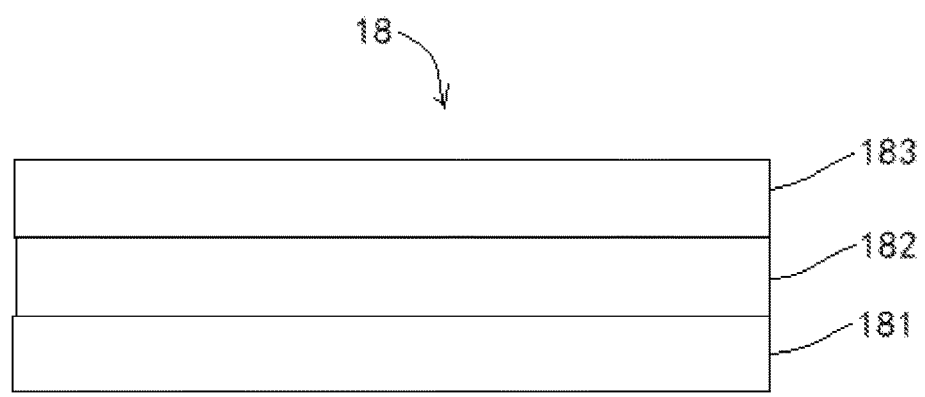
FIG. 2 is a schematic structural view of a metal trace according to an embodiment of the present invention.

A metal trace 18 is disposed on the dielectric layer 17. As shown in FIG. 2, the metal trace 18 sequentially includes a second metal layer 181, a third metal layer 182, and a fourth metal layer 183. In a specific manufacture, titanium is deposited in the via hole and on the dielectric layer 17 to form a second metal layer 181 having a thickness of 70 um to 90 nm, preferably 80 nm; then aluminum is deposited to form a third metal layer 182 having a thickness ranging from 550 nm to 650 nm, preferably 600 nm; and then titanium is deposited to form a fourth metal layer 183 having a thickness of 40 nm to 60 nm, preferably 50 nm, thus forming the metal trace 18 having a multi-layer structure of titanium-aluminum-titanium. The metal trace 18 in the via hole corresponding to the source region 1011 is served as the source 104, and the metal trace 18 in the via hole corresponding to the drain region 1012 is served as the drain 105. The multi-layered structure of titanium-aluminum-titanium can further enhance strength of the metal trace 18 to mitigate the stress generated when the metal trace 18 is bent, and to avoid the breakage phenomenon of the metal trace 18.

The planarization structure layer 19 is disposed on the dielectric layer 17 and the metal trace 18. The planarization structure layer 19 includes a first planarization layer 191 and a second planarization layer 192. The first planarization layer 191 is disposed on the dielectric layer 17 and the metal trace 18, and the second planarization layer 192 is disposed on the first planarization layer 191. The first planarization layer 191 and the second planarization layer 192 are both made of polyimide. Specifically, after the metal trace 18 is prepared, a material of polyimide is deposited on the dielectric layer 17 and the metal trace 18 to form a first planarization layer 191 having a thickness of 1 µm to 2 µm, preferably 1.5 µm. The material of polyimide is then deposited again to form a second planarization layer 192 having a thickness of from 2 µm to 4 µm, preferably 3 µm. The two planarization layers are formed by the two times of deposition, which further improve the flatness of the planarization structure layer 19. Then, a connection hole is formed in the planarization structure layer 19, and the connection hole penetrates from the planarization structure layer 19 to a surface of the drain electrode 105, so that the drain 105 is exposed in the connection hole.

Figure 3:
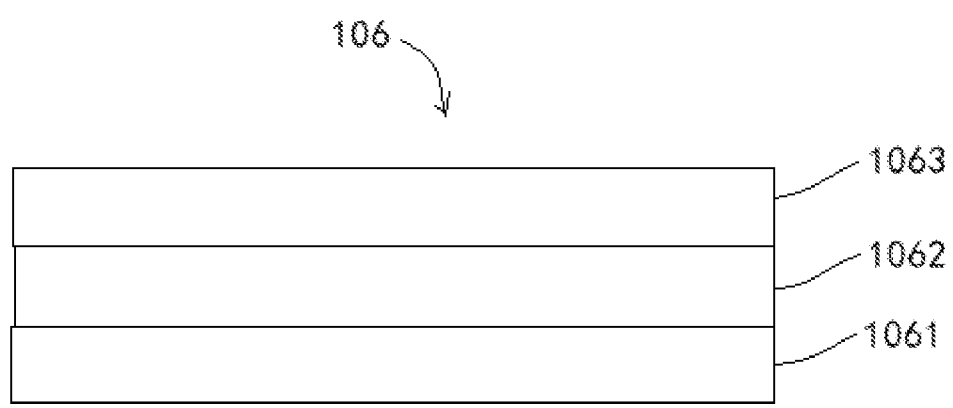
FIG. 3 is a schematic structural view of an anode trace according to an embodiment of the present invention.

The anode trace 106 is disposed on the planarization structure layer 19 and connected to the drain 105. As shown in FIG. 3, the anode trace 106 includes a first protective layer 1061, a first metal layer 1062, and a second protective layer 1063. In a manufacture process, a material of indium tin oxide is deposited on the second planarization layer 192 and in the connection hole to form the first protective layer 1061 having a thickness of 10 nm to 20 nm, preferably 15 nm; silver is deposited to formed a first metal layer 1062 having a thickness of 90 nm to 110 nm, preferably 100 nm; then a material of indium tin oxide is deposited to form a second protective layer 1063 having a thickness of 10 nm to 20 nm, preferably 15 nm, thus forming the anode trace 106 having a multi-layered structure of indium tin oxide-silver-indium tin oxide.

The present invention also provides a display device 1 including the array substrate 10 described in this embodiment. Of course, one of main design points of the present invention lies in the array substrate 10. As for the other structures or devices of the display device 1, such as a color filter substrate and a thin film encapsulation layer, the details are not described herein for brevity.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. An array substrate, comprising:
    a display area and a non-display area, the non-display area having a bending region connected to the display area;
    a first base layer extending from the display area to the bending region;
    a water-oxygen barrier layer disposed on the first base layer of the display area;
    a second base layer disposed on the water-oxygen barrier layer of the display area and on the first base layer of the bending region; and
    a metal trace disposed over the second base layer and extending from the display area to the bend region, wherein the metal trace has a multi-layer structure of titanium-aluminum-titanium.

2. The array substrate according to claim 1, wherein in the display area and the bending region, the array substrate further comprises:
    a buffer structure layer disposed on the second base layer;
    a first gate insulating layer disposed on the buffer structure layer;
    a second gate insulating layer disposed on the first gate insulating layer;
    a dielectric layer disposed on the second gate insulating layer, wherein the metal trace is disposed on the dielectric layer; and
    a planarization structure layer disposed on the dielectric layer and the metal trace.

3. The array substrate according to claim 2, wherein the buffer structure layer comprises:
    a first buffer layer disposed on the second base layer;
    a second buffer layer disposed on the first buffer layer; and
    a third buffer layer disposed on the second buffer layer;
    wherein the first buffer layer is made of silicon dioxide, the second buffer layer is made of silicon oxynitride, and the third buffer layer is made of silicon dioxide; and
    wherein the first buffer layer has a thickness of 450 nm to 550 nm, the second buffer layer has a thickness of 35 nm to 45 nm, and the third buffer layer has a thickness of 180 nm to 220 nm.

4. The array substrate according to claim 2, wherein the planarization structure layer comprises:
    a first planarization layer disposed on the dielectric layer and the metal trace; and a second planarization layer disposed on the first planarization layer;

wherein the first planarization layer and the second planarization layer are both made of polyimide, and wherein the first planarization layer has a thickness of 1 μm to 2 μm, and the second planarization layer has a thickness of 2 μm to 4 μm.

5. The array substrate according to claim 2, wherein in the display area, the array substrate further comprises:
   an active layer disposed on the buffer structure layer, the active layer having a source region and a drain region;
   a first gate layer disposed on the first gate insulating layer;
   a second gate layer disposed on the second gate layer;
   a source and a drain, the source extending from the metal trace to the source region of the active layer, the drain extending from the metal trace to the drain region of the active layer; and
   an anode trace disposed on the planarization structure layer and connected to the drain.

6. The array substrate according to claim 1, wherein the anode trace comprises:
   a first protective layer;
   a first metal layer disposed on the first protective layer; and
   a second protective layer disposed on the first metal layer;
   wherein the first protective layer has a thickness of 10 nm to 20 nm, and the first metal layer has a thickness of 90 nm to 110 nm; and
   wherein the second protective layer has a thickness of 10 nm to 20 nm.

7. The array substrate according to claim 1, wherein the first base layer and the second base layer are both made of polyimide, and the first base layer has a thickness of 5-15 um, and the second base layer has a thickness of 5-15 um.

8. The array substrate according to claim 1, wherein the metal layer comprises:
   a second metal layer;
   a third metal layer disposed on the second metal layer; and
   a fourth metal layer disposed on the third metal layer;
   wherein the second metal layer has a thickness of 70 nm to 90 nm, the third metal layer has a thickness of 550 nm to 650 nm, and the fourth metal layer has a thickness of 40 nm to 60 nm.

9. The array substrate according to claim 1, wherein the water-oxygen barrier layer is made of a material comprising at least one of silicon oxide, silicon nitride, and amorphous silicon.

10. A display device, comprising the array substrate according to claim 1.

* * * * *